United States Patent
Hori et al.

(10) Patent No.: US 10,622,544 B2
(45) Date of Patent: Apr. 14, 2020

(54) COMPOSITE SUBSTRATE AND ACOUSTIC WAVE DEVICE

(71) Applicant: NGK INSULATORS, LTD., Aichi (JP)

(72) Inventors: Yuji Hori, Owariasahi (JP); Tomoyoshi Tai, Inazawa (JP); Mitsuo Ikejiri, Inuyama (JP)

(73) Assignee: NGK INSULATORS, LTD., Aichi (JP)

( * ) Notice: Subject to any disclaimer, the term of this patent is extended or adjusted under 35 U.S.C. 154(b) by 199 days.

(21) Appl. No.: 15/810,714

(22) Filed: Nov. 13, 2017

(65) Prior Publication Data

US 2018/0083184 A1    Mar. 22, 2018

Related U.S. Application Data

(60) Division of application No. 14/737,655, filed on Jun. 12, 2015, now Pat. No. 9,917,246, which is a
(Continued)

(51) Int. Cl.
*H01L 41/332* (2013.01)
*H01L 21/321* (2006.01)
(Continued)

(52) U.S. Cl.
CPC ........ *H01L 41/332* (2013.01); *H01L 21/3212* (2013.01); *H01L 41/107* (2013.01);
(Continued)

(58) Field of Classification Search
CPC ... H01L 41/332; H01L 21/321; H01L 41/107; H01L 41/312; H01L 41/337;
(Continued)

(56) References Cited

U.S. PATENT DOCUMENTS

| 5,759,753 A | 6/1998 | Namba et al. |
| 5,923,231 A | 7/1999 | Ohkubo et al. |

(Continued)

FOREIGN PATENT DOCUMENTS

| JP | 09-092895 A | 4/1997 |
| JP | 09-208399 A | 8/1997 |

(Continued)

OTHER PUBLICATIONS

International Search Report for PCT Patent App. No. PCT/JP2013/084675 (dated Mar. 18, 2014).
(Continued)

*Primary Examiner* — Hovhannes Baghdasaryan
*Assistant Examiner* — Amie M Ndure
(74) *Attorney, Agent, or Firm* — Cermak Nakajima & McGowan LLP; Tomoko Nakajima

(57) ABSTRACT

A composite substrate production method of the invention includes (a) a step of mirror polishing a substrate stack having a diameter of 4 inch or more, the substrate stack including a piezoelectric substrate and a support substrate bonded to each other, the mirror polishing being performed on the piezoelectric substrate side until the thickness of the piezoelectric substrate reaches 3 μm or less; (b) a step of creating data of the distribution of the thickness of the mirror-polished piezoelectric substrate; and (c) a step of performing machining with an ion beam machine based on the data of the thickness distribution so as to produce a composite substrate have some special technical features.

4 Claims, 1 Drawing Sheet

Related U.S. Application Data continuation of application No. PCT/JP2013/084675, filed on Dec. 25, 2013.

(60) Provisional application No. 61/745,898, filed on Dec. 26, 2012.

(51) Int. Cl.
| | | |
|---|---|---|
| *H01L 41/312* | (2013.01) | |
| *H03H 3/08* | (2006.01) | |
| *H03H 9/02* | (2006.01) | |
| *H01L 41/337* | (2013.01) | |
| *H01L 41/107* | (2006.01) | |

(52) U.S. Cl.
CPC ......... *H01L 41/312* (2013.01); *H01L 41/337* (2013.01); *H03H 3/08* (2013.01); *H03H 9/02574* (2013.01); *Y10T 428/21* (2015.01)

(58) Field of Classification Search
CPC ........ H01L 21/3212; H03H 3/08; H03H 9/02; H03H 9/02574; Y10T 428/21
See application file for complete search history.

(56) References Cited

U.S. PATENT DOCUMENTS

| | | | | |
|---|---|---|---|---|
| 2003/0030119 | A1* | 2/2003 | Higgins, Jr. | ...... H01L 21/02381 257/428 |
| 2004/0070312 | A1* | 4/2004 | Penunuri | .................. H03H 3/08 310/313 A |
| 2007/0182279 | A1* | 8/2007 | Kawano | ................ G06F 3/0433 310/313 R |
| 2009/0280354 | A1 | 11/2009 | Mizuhara et al. | |
| 2011/0278993 | A1* | 11/2011 | Iwamoto | .................. H03H 3/02 310/345 |
| 2012/0056684 | A1 | 3/2012 | Kishi et al. | |
| 2012/0126669 | A1 | 5/2012 | Kobayashi et al. | |
| 2012/0229003 | A1* | 9/2012 | Ito | ........................... H03H 3/02 310/348 |
| 2014/0130319 | A1* | 5/2014 | Iwamoto | .................. H03H 3/02 29/25.35 |
| 2014/0167565 | A1* | 6/2014 | Iwamoto | .................. H03H 3/02 310/348 |
| 2015/0280107 | A1* | 10/2015 | Hori | ........................ H03H 3/08 310/313 R |

FOREIGN PATENT DOCUMENTS

| | | |
|---|---|---|
| JP | 2004-200432 A | 7/2004 |
| JP | 2004-221816 A | 8/2004 |
| JP | 2005-174991 A | 6/2005 |
| JP | 2007-214215 A | 8/2007 |
| JP | 2008-301066 A | 12/2008 |
| JP | 2010-109949 A | 5/2010 |
| JP | 2011-124738 A | 6/2011 |
| JP | 2012-060259 A | 3/2012 |
| JP | 2012-199762 A | 10/2012 |
| KR | 10-2009-0029201 A | 3/2009 |
| WO | WO96/04713 A1 | 2/1996 |
| WO | WO2011/013553 A1 | 2/2011 |
| WO | WO2014/104098 A1 | 7/2014 |

OTHER PUBLICATIONS

Written Opinion for PCT Patent App. No. PCT/JP2013/084675 (dated Mar. 18, 2014).
English language International Preliminary Report on Patentability for PCT Patent App. No. PCT/JP2013/084675 (dated Jul. 9, 2015).
Office Action from Japanese Patent App. No. 2014-554494 dated Sep. 12, 2017.
Office Action from Korean Patent App. No. 10-2015-7016846 (dated Nov. 29, 2019) with English language translation thereof.

* cited by examiner

◄──► 40nm

◄──► 40nm

COMPOSITE SUBSTRATE AND ACOUSTIC WAVE DEVICE

This application is a Divisional under 35 U.S.C. § 120 of U.S. patent application Ser. No. 14/737,655, filed Jun. 12, 2015, which was a national phase entry under 35 U.S.C. § 371 of PCT Patent Application No. PCT/JP2013/084675, filed Dec. 25, 2013, which claimed priority under 35 U.S.C. § 119 to U.S. Provisional Patent Application No. 61/745,898, filed Dec. 26, 2012, all of which are incorporated by reference.

DESCRIPTION OF THE BACKGROUND ART

1. Field of the Invention

The present invention relates to composite substrates, production methods thereof, and acoustic wave devices.

2. Description of the Related Art

The use of an ultrathin piezoelectric layer is expected to realize an acoustic wave device which may be operated at a higher frequency than heretofore possible. Chemical vapor deposition (CVD) and the Smart Cut technology are two exemplary methods capable of forming such thin layers. These two methods are known techniques. For example, the Smart Cut technology is described in Patent Literature 1.

CITATION LIST

Patent Literature

SUMMARY OF THE INVENTION

While CVD and the Smart Cut technology can form thin layers having a highly uniform thickness, the methods have the following respective problems.
1) CVD
  Crystallinity is very poor.
  The directions of crystal axes are limited.
2) Smart Cut technology
  Crystal defects remain due to insufficient recovery of damages by ion implantation.

Besides the above two methods, polishing of piezoelectric films into a small thickness has been attempted. However, this approach has resulted in the occurrence of breakage during the polishing or has been incapable of achieving a uniform thickness.

The present invention has been made in light of these problems discussed above. It is therefore an object of the invention to provide a piezoelectric single-crystal thin layer having high crystallinity, desired crystal axis and uniform thickness.

A composite substrate production method of the present invention includes:
  (a) a step of mirror polishing a substrate stack having a diameter of 4 inch or more, the substrate stack including a piezoelectric substrate and a support substrate bonded to each other, the mirror polishing being performed on the piezoelectric substrate side until the thickness of the piezoelectric substrate reaches 3 µm or less;
  (b) a step of creating data of the distribution of the thickness of the mirror-polished piezoelectric substrate; and
  (c) a step of performing machining with an ion beam machine based on the data of the thickness distribution so as to produce a composite substrate wherein the piezoelectric substrate has a thickness of 3 µm or less, the difference between the largest thickness and the smallest thickness of the piezoelectric substrate is 60 nm or less over the entire plane surface, and the piezoelectric substrate has such crystallinity that the full width at half maximum of an X-ray diffraction rocking curve is 100 arcsec or less.

This production method can eliminate the problems associated with CVD and the Smart Cut technology and can produce piezoelectric single-crystal thin layers having high crystallinity, desired crystal axis and uniform thickness.

A composite substrate according to the present invention includes a piezoelectric substrate and a support substrate bonded to each other and has a diameter of 4 inch or more,
  the piezoelectric substrate having a thickness of 3 µm or less, the difference between the largest thickness and the smallest thickness of the piezoelectric substrate being 60 nm or less over the entire plane surface of the piezoelectric substrate, the piezoelectric substrate having such crystallinity that the full width at half maximum of an X-ray diffraction rocking curve is 100 arcsec or less.

This composite substrate can be obtained easily by the aforementioned production method. The composite substrate may be used in acoustic wave devices.

DESCRIPTION OF THE PREFERRED EMBODIMENTS

Figure 1:
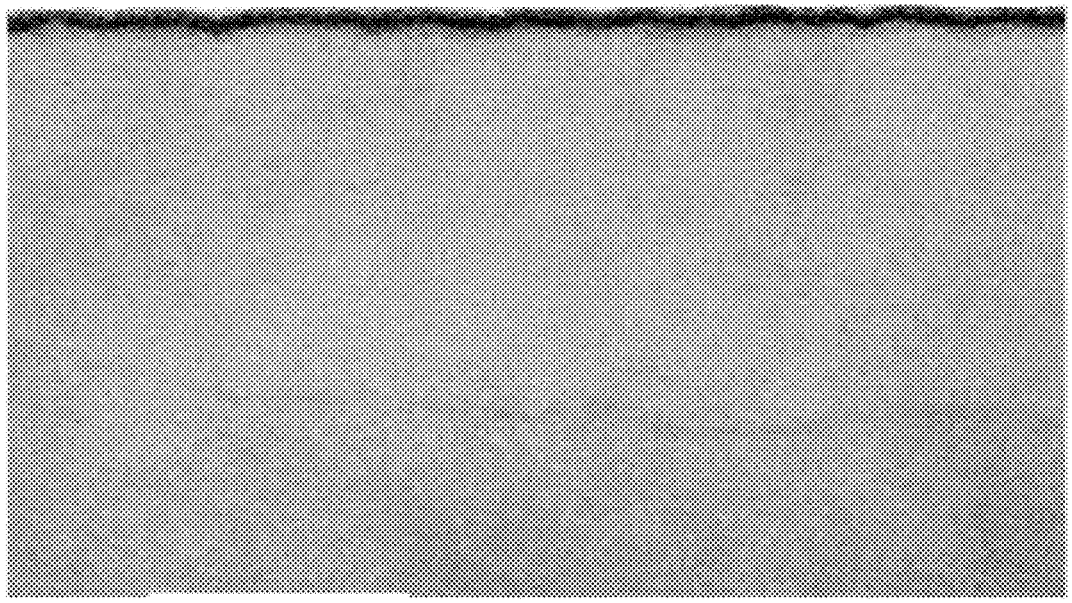
FIG. 1 is a sectional image of a piezoelectric substrate in EXAMPLE 1.

A preferred embodiment of the composite substrates of the present invention will be described hereinbelow. The composite substrate of the present embodiment includes a piezoelectric substrate and a support substrate bonded to each other and has a diameter of 4 inch or more. The piezoelectric substrate has a thickness of 3 µm or less, and the difference between the largest thickness and the smallest thickness of the piezoelectric substrate is 60 nm or less over the entire plane surface of the piezoelectric substrate. Further, the piezoelectric substrate has such crystallinity that the full width at half maximum of an X-ray diffraction rocking curve is 100 arcsec or less.

Examples of the materials of the piezoelectric substrates include lithium tantalate, lithium niobate, lithium niobate-lithium tantalate solid solution single crystal, lithium borate, langasite and rock crystal.

Examples of the materials of the support substrates include silicon, sapphire, aluminum nitride, alumina, alkali-free glass, borosilicate glass, quartz glass, lithium tantalate, lithium niobate, lithium niobate-lithium tantalate solid solution single crystal, lithium borate, langasite and rock crystal. The size of the support substrate is such that the diameter is the same as that of the piezoelectric substrate and the thickness is 100 to 1000 µm, and preferably 150 to 500 µm.

An electrode pattern may be formed on the surface of the piezoelectric substrate. In this manner, the composite substrate of the present embodiment may be used as an acoustic wave device.

Next, there will be described below a process for producing the composite substrate of the present embodiment.

Step (a)

A substrate stack (a composite substrate to be polished) is provided which has a diameter of 4 inch or more and includes a piezoelectric substrate with a thickness of 100 to 1000 µm and a support substrate with a thickness of 100 to 1000 µm bonded to each other. The piezoelectric substrate side is mirror polished until the thickness of the piezoelectric substrate reaches 3 µm or less. This substrate stack is a stack of a piezoelectric substrate and a support substrate bonded to each other via an organic adhesive layer or directly. Exemplary materials of the organic adhesive layers include epoxy resins and acrylic resins. The direct bonding may be accomplished by activating the respective bonding surfaces of the piezoelectric substrate and the support substrate and pressing the substrates against each other while the bonding surfaces are opposed to each other. For example, the bonding surfaces may be activated by irradiating the bonding surfaces with an ion beam of an inert gas (such as argon) or by the irradiation with plasma or a neutral atomic beam.

For example, the step (a) may be performed in such a manner that the piezoelectric substrate side of the substrate stack is ground first with a grinder and then lapped with a lapping machine and further the piezoelectric substrate side is mirror polished with a CMP machine until the thickness of the piezoelectric substrate reaches 3 µm or less. In this manner, the thickness of the piezoelectric substrate may be reduced to 3 µm or less efficiently. The term CMP is the abbreviation for chemical mechanical polishing.

Step (b)

Data of the distribution of the thickness of the mirror-polished piezoelectric substrate is created. For example, the data of the thickness distribution may be created by measuring the thickness of the mirror-polished piezoelectric substrate with an optical thickness meter utilizing laser interferometry. In this manner, the data of the thickness distribution may be created with high accuracy.

Step (c)

The piezoelectric substrate is machined with an ion beam machine based on the data of the thickness distribution. This step results in a composite substrate in which the piezoelectric substrate has a thickness of 3 µm or less, the difference between the largest thickness and the smallest thickness of the piezoelectric substrate is 60 nm or less over the entire plane surface, and the piezoelectric substrate has such crystallinity that the full width at half maximum of an X-ray diffraction rocking curve is 100 arcsec or less.

The step (c) may be performed in such a manner that the data of the thickness distribution is input to the ion beam machine to determine the lengths of the beam irradiation time for the respective points on the surface of the piezoelectric substrate and the piezoelectric substrate is machined in accordance with the lengths of the beam irradiation time. In this manner, the piezoelectric substrate may be machined with high accuracy. In this case, the output of the beam is constant and thicker regions are irradiated with the beam for a longer length of time. Alternatively, the step (c) may be performed in such a manner that the data of the thickness distribution is input to the ion beam machine to determine the beam outputs for the respective points on the surface of the piezoelectric substrate and the piezoelectric substrate is machined in accordance with the beam outputs. In this manner too, accurate machining is possible. In this case, the beam irradiation time is constant and thicker regions are irradiated with higher beam outputs.

The machining in the step (c) preferably involves an ion beam machine equipped with a DC-excited Ar beam source. Although an ion beam machine equipped with a plasma-excited Ar beam source is usable, the use of an ion beam machine having a DC-excited Ar beam source is advantageous in that damages to the surface of the piezoelectric substrate are further reduced.

According to the method for producing the composite substrate of the present embodiment discussed above, it is possible to eliminate the problems associated with CVD and the Smart Cut technology and also to produce piezoelectric single-crystal thin layers having high crystallinity, desired crystal axis and uniform thickness. The composite substrates produced by the production method may be used in acoustic wave devices.

It is needless to mention that the scope of the present invention is not limited to the embodiment discussed above and the present invention may be carried out in other various embodiments without departing from the technical scope of the invention.

EXAMPLES

Example 1

A silicon substrate (a support substrate) and a LiTaO$_3$ substrate (a piezoelectric substrate) were provided which had been each polished on both sides and each had a thickness of 230 µm and a diameter of 4 inch. These substrates were introduced into a vacuum chamber having a vacuum degree on the order of $10^{-6}$ Pa, and were held such that the bonding surfaces were opposed to each other. The bonding surfaces of both substrates were irradiated with Ar beam for 80 seconds to remove inactive layers and to activate the surfaces. Subsequently, the substrates were placed in contact with each other and were bonded together under a load of 1200 kgf. The resultant substrate stack was recovered and the piezoelectric substrate side was ground with a grinder until the thickness of the piezoelectric substrate reached 10 µm. Next, the substrate stack was set on a lapping machine and the piezoelectric substrate was polished with use of a diamond slurry until its thickness reached 3 µm. Further, the surface of the piezoelectric substrate was mirror polished with a CMP machine until its thickness reached 0.8 µm. During this process, a colloidal silica was used as the abrasive. The thickness of the piezoelectric substrate was measured with an optical thickness meter utilizing laser interferometry. As a result, the thickness over the entire surface of the piezoelectric substrate was 0.8 µm±0.1 µm. The measurement was made with respect to a total of 80 points over the entire plane surface of the piezoelectric substrate except the chamfered edges.

The substrate stack obtained in the above manner was set on an ion beam machine equipped with a plasma-excited Ar beam source. Next, the data of the thickness of the piezoelectric substrate obtained by the aforementioned measurement with the optical thickness meter was imported to the ion beam machine, and the amounts of machining, specifically, the lengths of the Ar beam irradiation time were determined for the respective measurement points on the piezoelectric substrate. The length of the beam irradiation time was adjusted by controlling the rate of the feed of the substrate stack. While changing the rate of the feed of the substrate stack, the entire surface of the piezoelectric substrate was irradiated with Ar beam at a constant output. The beam spot was 6 mm in diameter. RF plasma was excited under conditions in which the ion acceleration voltage and the ion current were constant at 1300 eV and 30 mA. The actual machining time was approximately 5 minutes.

The thickness of the piezoelectric substrate in the machined substrate stack (the composite substrate of this EXAMPLE) was measured again. As a result, the median thickness was 0.76 μm, and the difference between the largest thickness and the smallest thickness was 24 nm over the entire surface. A rocking curve was recorded with an X-ray diffractometer. The full width at half maximum (FWHM) was 80 arcsec and this value was the same as that of the bulk single crystal. This result confirmed that there was no degradation in crystallinity.

This composite substrate may be utilized in acoustic wave filters to realize devices having small variations in frequencies and exhibiting excellent filter characteristics.

Example 2

A substrate stack was fabricated in the same manner as in EXAMPLE 1. The thickness of the piezoelectric substrate was measured with an optical thickness meter utilizing laser interferometry. As a result, the thickness over the entire surface of the piezoelectric substrate was 1.0 μm±0.12 μm. Similarly to EXAMPLE 1, the total number of the measurement points was 80.

The substrate stack obtained in the above manner was set on an ion beam machine equipped with a DC-excited Ar beam source. Next, the data of the thickness of the piezoelectric substrate obtained by the aforementioned measurement with the optical thickness meter was imported to the ion beam machine, and the amounts of machining, specifically, the Ar beam outputs were determined for the respective measurement points on the piezoelectric substrate. While feeding the substrate stack at a feed rate of 0.5 mm/sec (constant), the entire surface of the piezoelectric substrate was irradiated with Ar beam at the Ar beam outputs varied in the range of 20 to 100 W. The beam spot was 6 mm in diameter. Since the feed rate was constant, the length of the beam irradiation time was the same over the entire surface of the piezoelectric substrate.

The thickness of the piezoelectric substrate in the machined substrate stack (the composite substrate of this EXAMPLE) was measured again. As a result, the median thickness was 0.92 μm, and the difference between the largest thickness and the smallest thickness was 50 nm over the entire surface. A rocking curve was recorded with an X-ray diffractometer. The full width at half maximum (FWHM) was 65 arcsec and this value was the same as that of the bulk single crystal. This result confirmed that there was no degradation in crystallinity.

Figure 2:
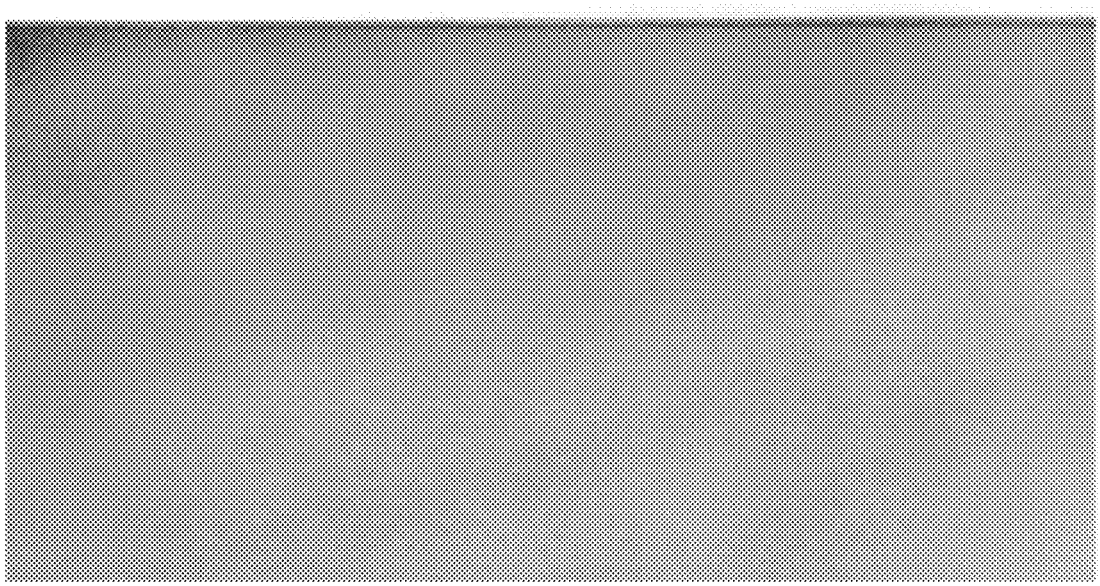
FIG. 2 is a sectional image of a piezoelectric substrate in EXAMPLE 2.

Cross sections near the surface of the piezoelectric substrates in EXAMPLE 1 and EXAMPLE 2 were observed with a TEM. The observation showed the presence of damage layers on the surface of both substrates. FIG. 1 is a sectional image obtained in EXAMPLE 1, and FIG. 2 is a sectional image obtained in EXAMPLE 2. The thickness of the damage layer (the surface black layer) in EXAMPLE 1 was 10 nm, and the damage layer in EXAMPLE 2 had a thickness of 3 nm. This result has illustrated that an ion beam machine equipped with a DC-excited Ar beam source inflicts less damage to the surface than does an ion beam machine equipped with a plasma-excited Ar beam source.

To estimate the influence of damage layers on device characteristics, electrodes of SAW resonators were formed on the piezoelectric substrates in the composite substrates of EXAMPLES 1 and 2. The electrode pitches were 4 μm. Similar resonator characteristics having a central frequency of about 930 MHz were obtained between the inventive resonators and resonators fabricated on usual piezoelectric substrates. Namely, it has been demonstrated that the presence of damage layers with a thickness of about 10 nm does not affect the characteristics.

This application claims priority from U.S. Provisional Application No. 61/745,898 filed on Dec. 26, 2012, the entire content of which is incorporated herein by reference.

Industrial Applicability

The present invention may be applied to acoustic wave devices such as SAW filters.

What is claimed is:

1. A composite substrate having a diameter of 4 inch or more comprising:
   a support substrate; and
   a piezoelectric substrate bonded to the support substrate,
   wherein the piezoelectric substrate has a thickness of 3 μm or less,
   wherein a difference between the largest thickness and the smallest thickness of the piezoelectric substrate is 60 nm or less over the entire place surface of the piezoelectric substrate, and
   wherein the piezoelectric substrate has a crystallinity that the full width at half maximum of an X-ray diffraction rocking curve is 100 arcsec or less.

2. The composite substrate according to claim 1, further comprising:
   a damage layer between the piezoelectric substrate and the support substrate,
   wherein a thickness of the damage layer is 3 nm or more and 10 nm or less.

3. An acoustic wave device comprising:
   a support substrate;
   a piezoelectric substrate bonded to the support substrate; and
   an electrode formed on the piezoelectric substrate,
   wherein the piezoelectric substrate has a thickness of 3 μm or less,
   wherein a difference between the largest thickness and the smallest thickness of the piezoelectric substrate is 60 nm or less over the entire place surface of the piezoelectric substrate, and
   wherein the piezoelectric substrate has a crystallinity that the full width at half maximum of an X-ray diffraction rocking curve is 100 arcsec or less.

4. The acoustic wave device according to claim 3, further comprising:
   a damage layer between the piezoelectric substrate and the support substrate,
   wherein a thickness of the damage layer is 3 nm or more and 10 nm or less.

* * * * *